US012740118B2

(12) United States Patent
Magnusson Lindgren et al.

(10) Patent No.: US 12,740,118 B2
(45) Date of Patent: Sep. 15, 2026

(54) POLYCRYSTALLINE SILICON CARBIDE SUBSTRATE WITH DENSITY GRADIENT AND METHOD OF MANUFACTURING THE SAME

(71) Applicant: STMicroelectronics International N.V., Geneva (CH)

(72) Inventors: Björn Magnusson Lindgren, Norrköping (SE); Carlo Riva, Renate (IT)

(73) Assignee: STMicroelectronics International N.V., Geneva (CH)

( * ) Notice: Subject to any disclaimer, the term of this patent is extended or adjusted under 35 U.S.C. 154(b) by 351 days.

(21) Appl. No.: 18/614,522

(22) Filed: Mar. 22, 2024

(65) Prior Publication Data

US 2024/0332366 A1 Oct. 3, 2024

(30) Foreign Application Priority Data

Mar. 31, 2023 (SE) .................................... 23503782

(51) Int. Cl.
*H10D 62/832* (2025.01)
*C30B 28/02* (2006.01)
(Continued)

(52) U.S. Cl.
CPC ......... *H10D 62/8325* (2025.01); *C30B 28/02* (2013.01); *C30B 29/36* (2013.01);
(Continued)

(58) Field of Classification Search
CPC .... H10D 62/8325; H10D 62/40; C30B 28/02; C30B 29/36; C30B 33/02; H10P 14/2904;
(Continued)

(56) References Cited

U.S. PATENT DOCUMENTS 5,417,803 A 5/1995 Goldstein et al.
6,479,174 B1 * 11/2002 Yamada ................ C23C 16/325 428/323

(Continued)

FOREIGN PATENT DOCUMENTS

CN 114864529 A 8/2022
EP 1657227 A1 5/2006

(Continued)

OTHER PUBLICATIONS

Ballarin et al., "Electropolishing of n-type 3C-polycrystalline silicon carbide," *Electrochemistry Communications 40*:17-19, 2014.

(Continued)

*Primary Examiner* — Victor A Mandala
(74) *Attorney, Agent, or Firm* — Seed IP Law Group LLP

(57) ABSTRACT

A polycrystalline silicon carbide (SiC) substrate with a density gradient between a first side of the polycrystalline SiC substrate and a second side of the polycrystalline SiC substrate opposite to the first side. A first density at the first side of the polycrystalline SiC substrate is less than a second density at the second side of the polycrystalline SiC substrate. The polycrystalline SiC substrate with the density gradient may be formed by forming a polycrystalline SiC base substrate with a sintering process followed by a post-sintering process. For example, the post sintering process may be at least one of the following of: applying a first temperature to the first side and a second temperature to the second side of the polycrystalline SiC substrate and performing a chemical vapor deposition (CVD) process to impregnate further silicon (Si) and carbon (C) atoms into the polycrystalline SiC base substrate.

20 Claims, 5 Drawing Sheets

(51) Int. Cl.

| | |
|---|---|
| ***C30B 29/36*** | (2006.01) |
| ***C30B 33/02*** | (2006.01) |
| ***H10D 62/40*** | (2025.01) |
| ***H10P 14/20*** | (2026.01) |

(52) U.S. Cl.
CPC ............. *C30B 33/02* (2013.01); *H10D 62/40* (2025.01); *H10P 14/2904* (2026.01); *H10P 14/2926* (2026.01)

(58) Field of Classification Search
CPC .. H10P 14/2926; H10P 14/3408; H10P 95/90; H10P 90/00
See application file for complete search history.

(56) References Cited

U.S. PATENT DOCUMENTS

| | | | | |
|---|---|---|---|---|
| 6,562,183 | B1 * | 5/2003 | Yamada | C23C 16/325 428/408 |
| 10,934,634 | B2 | 3/2021 | Yagi et al. | |
| 2004/0164380 | A1 * | 8/2004 | Nagasawa | C30B 25/02 257/E21.123 |
| 2009/0202814 | A1 | 8/2009 | Jabado et al. | |
| 2011/0284873 | A1 | 11/2011 | Nishiguchi et al. | |
| 2013/0234164 | A1 | 9/2013 | Nagasawa et al. | |
| 2017/0368780 | A1 | 12/2017 | Middlemiss | |
| 2022/0178048 | A1 | 6/2022 | Kaneko et al. | |
| 2025/0006799 | A1 * | 1/2025 | Kawamura | H10D 62/82 |

FOREIGN PATENT DOCUMENTS

| | | | |
|---|---|---|---|
| EP | 3591101 | A1 | 1/2020 |
| JP | H11121315 | A | 4/1999 |
| JP | H11329974 | A | 11/1999 |
| JP | 2009117533 | A | 5/2009 |
| WO | 2022163052 | A1 | 8/2022 |

OTHER PUBLICATIONS

Ho et al., "Investigation of Polishing Pads Impregnated with Fe and $Al_2O_3$ Particles for Single-Crystal Silicon Carbide Wafers," *Appl. Sci. 6*, 89, 2016. (8 pages).

Peter T. B. Shaffer et al., "The elastic modulus of dense polycrystalline silicon carbide", Mat. Res. Bull. vol. 7, 63-70 (1972).

* cited by examiner

POLYCRYSTALLINE SILICON CARBIDE SUBSTRATE WITH DENSITY GRADIENT AND METHOD OF MANUFACTURING THE SAME

BACKGROUND

Technical Field

The present disclosure is directed to a polycrystalline silicon carbide (SiC) base substrate or wafer including a first density at a first side, a second density at a second side opposite to the first side, and a density gradient that increases from the second side towards the first side.

Description of the Related Art

The semiconductor industry has been showing considerable interest in silicon carbide (SiC), in particular for the manufacture of electronic devices or components (e.g., diodes, transistors, or other similar power applications).

Development and manufacture of silicon carbide based electronic devices are limited by factors such as electrical and mechanical properties from forming silicon carbide wafers. Many silicon carbide wafers have a density that is uniform (e.g., the same or substantially the same) across the entire length, width, and thickness of the wafer.

Before coupling or forming further layers on the silicon carbide wafer, a surface of the silicon carbide wafer may be planarized and polished such that the surface is flat and smooth. For example, for a silicon carbide wafer with a higher density, there are smaller voids and potentially fewer voids, which result in a smoother surface. However, the higher density wafer uses more material to increase the density, which increases manufacturing costs. However, the higher density benefits the later manufacturing steps.

BRIEF SUMMARY

The present disclosure is directed to providing embodiments of silicon carbide (SiC) wafers, which may be polycrystalline SiC wafers, with a density gradient between a first side and a second side. The SiC wafer may be formed using a sintering process followed by a temperature treatment to form the density gradient. Alternatively, the sintering process can be combined with a chemical vapor deposition to form the density gradient.

At least one embodiment includes a polycrystalline SiC wafer or substrate having a first side and a second side opposite to the first side. A first density is at the first side of the polycrystalline silicon carbide (SiC) material. A second density is at the second side of the polycrystalline silicon carbide (SiC) material, the second density being greater than the first density. A density gradient is between the first side and the second side. The density gradient may increase in density in a density gradient direction directed from the first side towards the second side of the polycrystalline SiC wafer.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify the same or similar elements or acts unless the context indicates otherwise. The sizes and relative proportions of the elements in the drawings are not necessarily drawn to scale. For example, some of these elements may be enlarged and positioned to improve drawing legibility.

DETAILED DESCRIPTION

Figure 1A:
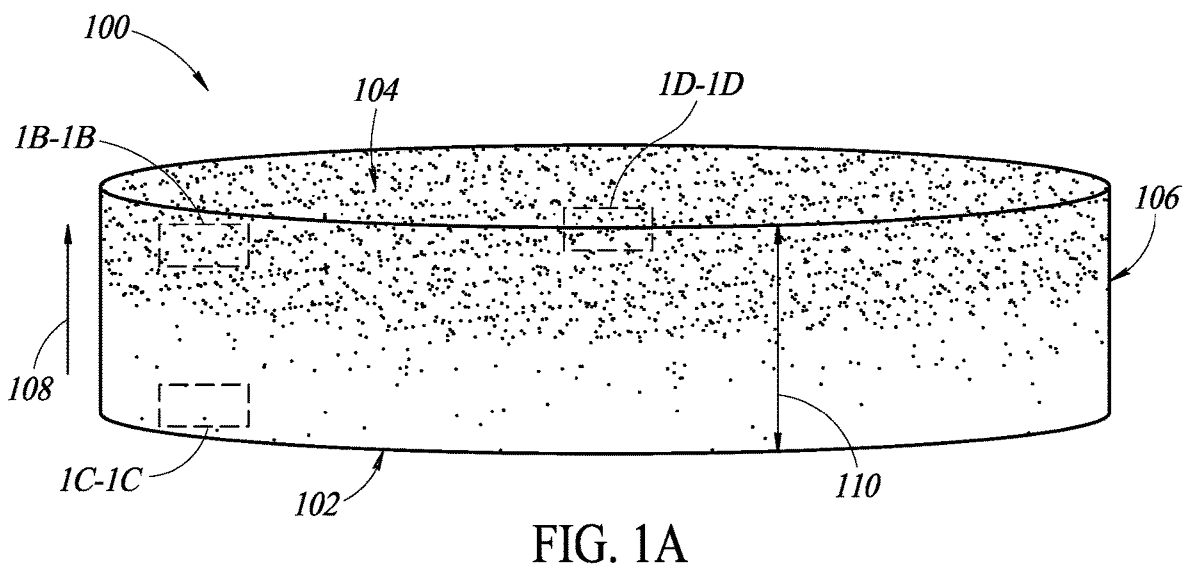
FIG. 1A is a side perspective view of an embodiment of a polycrystalline silicon carbide (SiC) substrate having a density gradient.

In the following description, certain details are set forth in order to provide a thorough understanding of various embodiments of devices, methods, and articles. However, one of skill in the art will understand that other embodiments may be practiced without these details. In other instances, well-known structures and methods associated with, for example, silicon carbide substrates or layers (e.g., polycrystalline silicon carbide, monocrystalline silicon carbide, etc.), semiconductor fabrication processes, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles may not be drawn to scale, and some of these elements may be enlarged and positioned to improve drawing legibility.

The use of "transverse" means that a surface, a sidewall, or similar or like structure or feature is at an angle with respect to another respective surface, sidewall, or similar or like respective structure or feature. For example, if a first surface is transverse to a first sidewall, the first surface may be at an angle that is equal to 25-degrees, 35-degrees, 45-degrees, 75-degrees, 90-degrees, 120-degrees, and so forth.

Generally, polycrystalline silicon carbide (SiC) substrates, wafers, or layers have been utilized within various electronic devices and components (e.g., semiconductor die, semiconductor packages, semiconductor transistors, etc.). These polycrystalline SiC substrates have a resistivity that results in a resistance being present along an electrical pathway that passes through the polycrystalline SiC substrate. This resistance impedes an electrical signal as it passes through the electrical pathway is known as an on-resistance (Ron). This on-resistance (Ron) of the polycrystalline SiC substrate limits an efficiency or electrical characteristics of the electronic devices made from the polycrystalline SiC substrates. For example, if the on-resistance (Ron) is high, the electrical signal may be impeded from fully passing through the polycrystalline SiC substrates to reach its destination resulting in functional errors within the electronic devices or components.

As polycrystalline SiC substrates are formed, the density impacts the formation of voids or otherwise affects the roughness of a surface on which subsequent layers or devices are formed. The present disclosure is directed to manufacturing polycrystalline SiC substrates with flat surfaces that is less expensive and results in fewer voids. This is in contrast to a conventional polycrystalline SiC substrate that is initially formed utilizing a sintering process, where larger voids are present between grains. These voids may be present at or adjacent to a surface of the conventional polycrystalline SiC substrate that is to be planarized and polished (i.e., flattened). Before planarizing and polishing, the surface of the conventional polycrystalline SiC substrate may be relatively rough and unlevel due in part to the different grain sizes and crystalline structure.

After planarizing and polishing, the surface of the conventional polycrystalline SiC substrate is flat (i.e., level) and smooth (i.e., polished). However, during this planarizing and polishing process, the voids that are present at or adjacent to the surface of the conventional polycrystalline SiC substrate form indents or recesses. After the surface has been planarized and polished, another layer is generally formed on the surface of the conventional polycrystalline SiC substrate. When this layer is formed on the surface of the conventional polycrystalline SiC substrate with the indents and recesses, defect voids are formed between the layer and the surface. These defect voids may increase the on-resistance (Ron) as discussed above causing a semiconductor package or device that includes the layer and the conventional polycrystalline SiC substrate to not operate within efficiency tolerances.

Costs may be reduced by manufacturing the conventional polycrystalline SiC substrate to have a low density. However, the low density forms a relatively rough surface due to a greater number of defect voids. This results in ridges and raised regions still remaining even after polishing and planarizing the surface of the low density polycrystalline SiC substrate.

The present disclosure is directed to one or more embodiments of a polycrystalline SiC substrate that has a density gradient such that a first density at a first surface of the substrate is less than a second density at a second surface of the substrate opposite to the first surface. The second density at the second surface may allow for the second surface to be polished and planarized more effectively to increase a strength of bonding between a layer of material (e.g., semiconductor material, silicon material, etc.) that is later formed on the second surface. While at the same time, the cost of manufacturing the polycrystalline SiC substrate with the density gradient is reduced in overall manufacturing costs as compared to manufacturing the high density conventional polycrystalline SiC. In other words, the polycrystalline SiC substrate with the density gradient has the benefit of being manufactured with a surface that is more flat and less rough than the low density conventional polycrystalline SiC substrate and less expensive than the high density conventional polycrystalline SiC substrate.

At least one embodiment of a device of the present disclosure is summarized as follows. The device includes a polycrystalline silicon carbide (SiC) wafer including a first side and a second side opposite to the first side. A first density is at the first side of the polycrystalline silicon carbide (SIC) wafer, and a second density is at the second side of the polycrystalline silicon carbide (SiC) wafer. The second density is greater than the first density. A density gradient is between the first side and the second side, and the density gradient increasing in density in a density gradient direction directed from the first side towards the second side of the polycrystalline silicon carbide (SiC) wafer.

At least one embodiment of a method of present disclosure is summarized as follows. The method includes forming a polycrystalline silicon carbide (SiC) substrate. After forming the polycrystalline silicon carbide (SiC) substrate, generating a density gradient between a first side of the polycrystalline silicon carbide (SiC) substrate and a second side of the polycrystalline silicon carbide (SiC) substrate opposite to the first side by motivating mass transport directed in a mass transport direction directed from the first side to the second side of a polycrystalline silicon carbide base substrate opposite to the first side. The motivating the mass transport includes exposing the first side of the polycrystalline silicon carbide (SiC) substrate to a first temperature transporting mass away from the first side of the polycrystalline silicon carbide (SiC) substrate, and exposing the second side of the polycrystalline silicon carbide (SiC) substrate to a second temperature transporting mass toward the second side of the polycrystalline silicon carbide (SiC) substrate, the second temperature being less than the first temperature. Cooling the polycrystalline silicon carbide (SiC) substrate generating a first density at the first side of the polycrystalline silicon carbide (SIC) substrate, a second density at the second side of the polycrystalline silicon carbide (SiC) substrate greater than the first density, and the density gradient between the first side and the second side of the polycrystalline silicon carbide (SiC) substrate.

At least one embodiment of a method of present disclosure is summarized as follows. The method includes generating a density gradient between a first side of a polycrystalline silicon carbide (SiC) substrate and a second side of the polycrystalline silicon carbide (SiC) substrate opposite to the first side. The generating the density gradient between the first side and the second side includes exposing the second side of the polycrystalline silicon carbide (SiC) substrate to a chemical vapor deposition process impregnating silicon (Si) and carbon (C) into the second side of the polycrystalline silicon carbide (SiC) substrate.

FIG. 1A is directed to a side perspective view of a polycrystalline silicon carbide (SiC) substrate 100 with a density gradient, which may be referred to as a substrate 100 as follows herein. The substrate 100 may be a wafer, which may be cylindrical as shown in FIG. 1A.

The substrate 100 includes a first surface 102, a second surface 104 that is opposite to the first surface 102. A first sidewall 106 that is transverse to the first surface 102 and the second surface 104 and extends from the first surface 102 to the second surface 104. The second surface 104 has a roughness that is less than or equal to 5-angstroms (Å) and is level such that the second surface 104 is flat (i.e., polished, smooth, planarized, and level). The first surface 102 may be a rear, back, bottom, or lower surface based on the orientation of the substrate 100 as shown in FIG. 1A, and the second surface 104 may be a front, top, or upper surface based on the orientation of the substrate 100 as shown in FIG. 1A.

A first density of the substrate 100 is at the first surface 102 and a second density of the substrate 100 is at the second surface 104. The first density of the substrate 100 is different from the second density of the substrate 100. For example, the first density is less than the second density. The substrate 100 with the density gradient includes a density gradient direction represented by arrow 108 that is directed in a direction directed away from the first surface 102 and directed towards the second surface 104. The density gradient of the substrate 100 increases along the substrate 100 between the first surface 102 and the second surface 104 in the density gradient direction 108. The density gradient increases in the density gradient direction 108 such that the first density at the first surface 102 is the lowest density of the density gradient and the second density at the second surface 104 is the highest density of the density gradient. In at least one embodiment, the first density is within the range of 2.75-3.05 grams per centimeter cubed (i.e., 2.75-3.05 $g/cm^3$) or is equal to the upper and lower ends of this range (i.e., equal to 2.75 $g/cm^3$ or equal to 3.05 $g/cm^3$). In at least one embodiment, the second density is within the range of 3.05-3.20 grams per centimeter cubed (i.e., 3.05-3.20 $g/cm^3$) or is equal to the upper and lower ends of this range (i.e., equal to 3.05 $g/cm^3$ or equal to 3.20 $g/cm^3$). In some embodiments, the second density may range from 3.10-3.20 grams per centimeter cubed (i.e., 3.10-3.20 $g/cm^3$) or may be equal to the upper and lower ends of this range (i.e., equal to 3.10 $g/cm^3$ or equal to 3.20 $g/cm^3$). In some embodiments, the second density may range from 3.10-3.26 grams per centimeter cubed (i.e., 3.10 $g/cm^3$-3.26 $g/cm^3$) mor may be equal to the upper and lower ends of this range (i.e., equal to 3.10 $g/cm^3$ or equal to 3.26 $g/cm^3$).

In some embodiments, the first density at the first surface 102 of the substrate 100 may be within a range from 2.5-3.0 $g/cm^3$ and the second density at the second surface may be within a range from 3.0-3.3 $g/cm^3$. In some embodiments, the second density at the second surface 104 of the substrate 100 may be within a range from 3.2-3.3 $g/cm^3$. The percentages of voids present at or in close proximity to the first surface 102 of the substrate 100 ranges from 20% to 25%, or may be equal to the upper and lower ends of this range. The percentages of the voids present at or in close proximity to the second surface 104 of the substrate 100 ranges from 2% to 0.5%, or may be equal to the upper and lower ends of this range.

In some embodiments, as the density increases from the first density at the first surface 102 to the second surface 104 of the substrate 100, the density increases linearly.

The substrate 100 includes a first thickness 110. The first thickness 110 may be within the range of 200-micrometers (μm) to 1.2-millimeters (mm) or may be equal to the upper and lower ends of this range (i.e., equal to 200-micrometers (μm) or equal to 1.2-millimeters (mm)). In some embodiments, the first thickness 110 may be greater than 1.2-millimeters (mm) or may be less than 200-micrometers (μm). In some embodiments, the first thickness 110 may be substantially equal to 1-millimeter (mm).

Respective grains at or in close proximity to the first surface 102 of the substrate 102 (e.g., in the region with the first density) may have a size ranging from 1 micrometer (μm) to 20 micrometers (μm) or equal to the upper and lower ends of this range. Respective grains at or in close proximity to the second surface 104 of the substrate 100 (e.g., within the region with the second density) may have a size ranging from 10 micrometers (μm) to 30 micrometers (μm) or equal to the upper and lower ends of this range. Respective grains at a midpoint between the first surface 102 and the second surface 104 may have a size ranging from 5 micrometers (μm) to 25 micrometers (μm) or equal to the upper and lower ends of this range. Respective grain boundaries at or in close proximity to the first surface 102 of the substrate 100 may have a size ranging from 1 micrometer (μm) to 20 micrometers (μm) or equal to the upper and lower ends of this range. Respective grains at or in close proximity to the second surface 104 of the substrate 100 may have a size ranging from 10 micrometers (μm) to 30 micrometers (μm) or equal to the upper and lower ends of this range. Respective voids at or in close proximity to the first surface 102 of the substrate 100 (e.g., within the region with the first density) may range from 5 micrometers (μm) to 50 micrometers (μm) or may be equal to the upper and lower ends of this range, and, preferably, the respective voids at or in close proximity to the first surface 102 of the substrate 100 (e.g., within the region with the first density) may range from 25 micrometers (μm) to 40 micrometers (μm), or may be equal to the upper and lower ends of this preferred range. Respective voids at or in close proximity to the second surface 104 of the substrate 100 may have a size less than or equal to 5 micrometers (μm). Respective voids at or in close proximity to the first surface 102 of the substrate 100 may have a size less than or equal to 10 micrometers (μm).

Figure 1B:
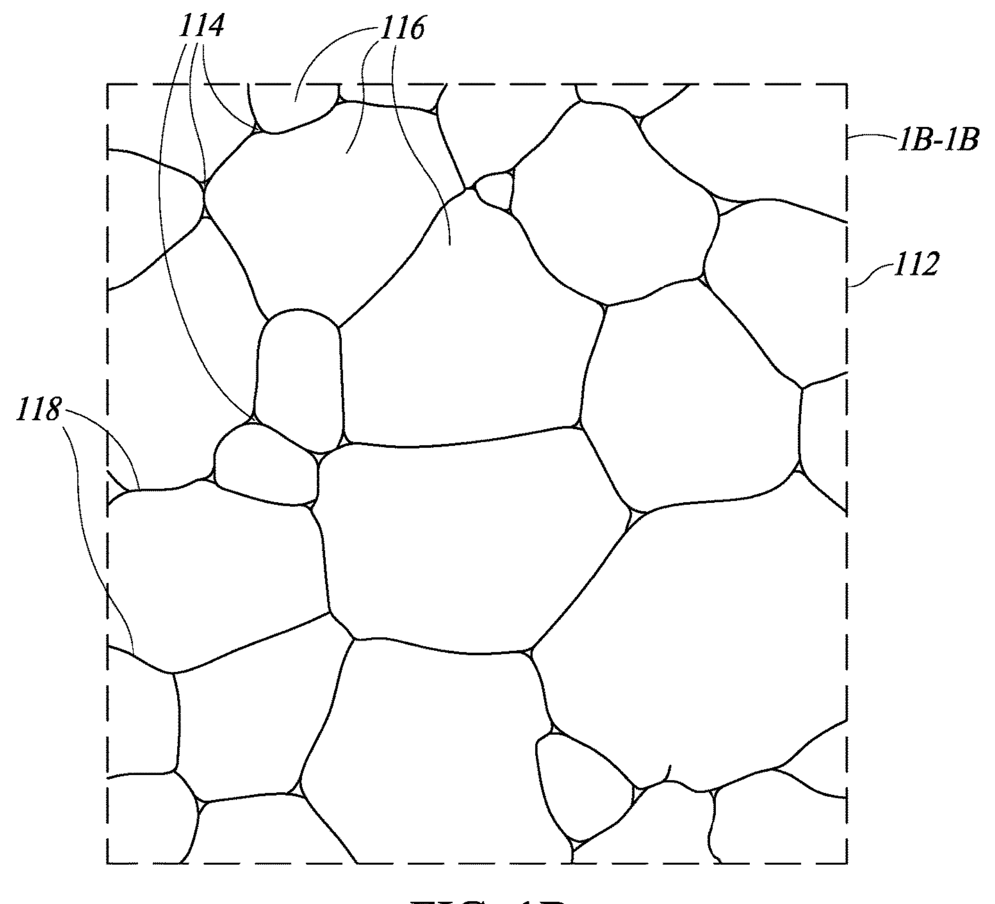
FIG. 1B is a zoomed in and enhanced view of section 1B-1B of the embodiment of the polycrystalline SiC substrate in FIG. 1A.

FIG. 1B is a zoomed in and enhanced view of section 1B-1B as encircled in FIG. 1A. A first portion 112 of the substrate 100 is shown in FIG. 1B and is in close proximity to the second surface 104 of the substrate 100 such that the first portion 112 of the substrate 100 has a respective density that is greater than the first density at the first surface 102 and less than the second density at the second surface 104. Since the first portion 112 of the substrate 100 shown in FIG. 1B is between the first surface 102 and the second surface 104, the respective density of the first portion 112 is less than respective densities of respective portions of the substrate 100 closer to the second surface 104 than the first portion 112 and is greater than respective densities of respective portions of the substrate 100 closer to the first surface 102 than the first portion 112. In other words, the first portion 112 is closer to the second surface 104 than the first surface 102.

As the density is slightly less than the second density of the substrate 100 at the second surface 104, there are very small or very few voids 114 between grains 116 of the substrate 100 at the first portion 112 of the substrate 100. As the voids 114 are very small or low in number, the first portion 112 of the substrate 100 has a relatively high density as the first portion 112 is in close proximity to the second surface 104 of the substrate 100. The voids 114 may be present between adjacent ones of the grains 116, and at least some of the voids 114 may be present along grain boundaries 118 between the grains 116 of the substrate 100.

Figure 1C:
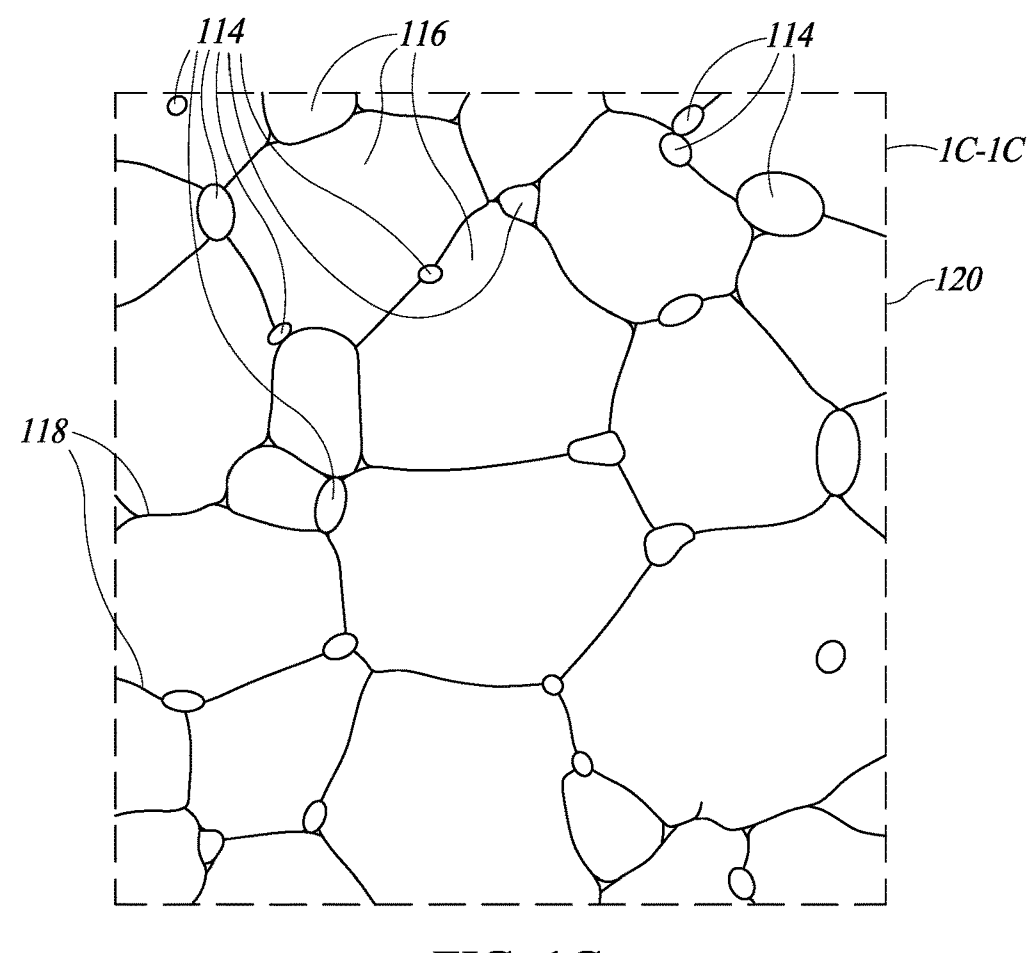
FIG. 1C is a zoomed in and enhanced view of section 1C-1C of the embodiment of the polycrystalline SiC substrate in FIG. 1A.

FIG. 1C is a zoomed in and enhanced view of section 1C-1C as encircled in FIG. 1A. A second portion 120 of the substrate 100 is shown in FIG. 1C and is in close proximity to the first surface 102 of the substrate 100 such that the second portion 112 of the substrate has a respective density that is greater than the first density at the first surface and is less than the second density at the second surface 104. Since the second portion of the substrate 100 shown in FIG. 1C is between the first surface 102 and the second surface 104, the respective density of the second portion 120 is less than respective densities of respective portions of the substrate 100 closer to the second surface 104 than the second portion and is greater than respective densities of respective portions of the substrate 100 closer to first surface 102 of the substrate 100. In other words, the second portion 120 is closer to the first surface 102 than the second surface 104.

As shown in the embodiment in FIGS. 1B and 1C, the respective voids 114 present between the grains 116 and along the grain boundaries 118 in the second portion 120 as shown in FIG. 1B are larger than the respective voids 114 present between the grains 116 and along the grain boundaries 118 in the first portion 112. The respective voids 114 in the second portion 120 being larger than the respective voids in the first portion 112 means that the second portion 120 has a respective density that is less than a respective density of the first portion 112.

In some embodiments of the substrate 100, a first number of the respective voids 114 present at the first portion 112 may be less than a second number of respective voids 114 at the second portion 120. As the respective voids 114 are generally larger and are in greater number in the second portion 120 relative to those respective voids 114 present within the first portion 112, the first portion 112 of the substrate 100 has a respective density that is greater than a respective density of the second portion 120 of the substrate 100.

Figure 1D:
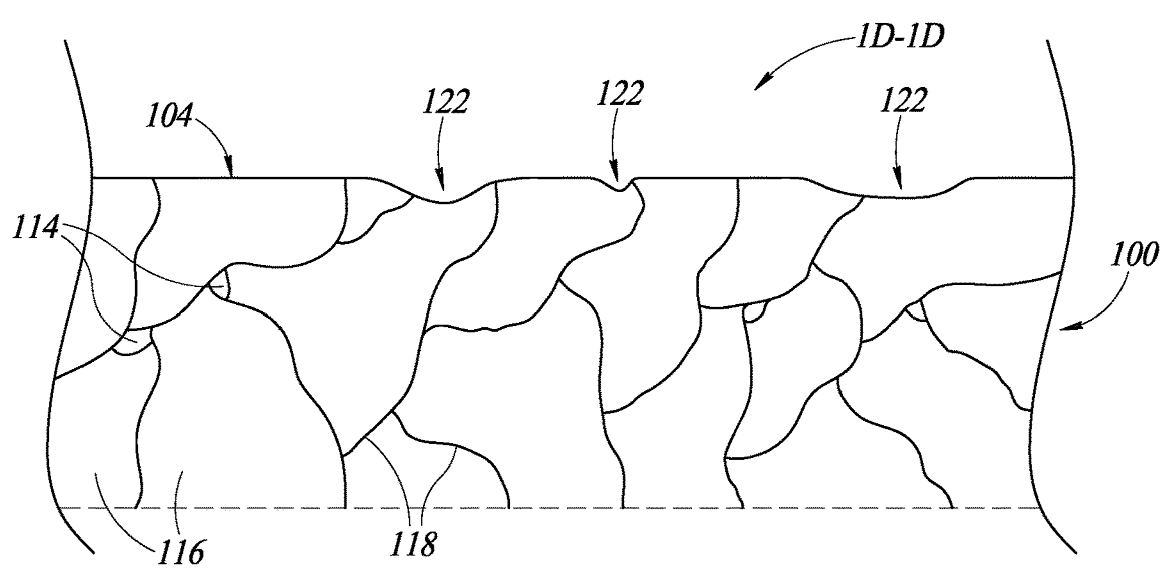
FIG. 1D is a zoomed in and enhanced view of section 1D-1D of the embodiment of the polycrystalline SiC substrate in FIG. 1A.

FIG. 1D is a zoomed in and enhanced view of section 1D-1D of the embodiment of the polycrystalline SiC substrate 100 as shown in FIG. 1A. As shown in FIG. 1D, the second surface 104 includes slight indentations 122 that are present along the second surface 104. The voids 114 may cause the slight indentations 122 at the second surface 104 after the second surface 104 has been planarized and polished. The details of planarizing and polishing the second surface 104 will be discussed in detail later herein. However, these slight indentations 122 are much smaller than those as compared to if a similar or like surface of the low density conventional polycrystalline SiC substrate were planarized and polished. For example, when the similar or like surface of the low density conventional polycrystalline SiC substrate is planarized and polished, respective indentations would be much larger such that larger ridges and raised portions would be present at the similar or like surface of low density conventional polycrystalline SiC substrate. In other words, the indentations 122 of the planarized and polished second surface 104 of the substrate 100 would be more similar or like to indentations that were present at a similar or like surface that is planarized and polished of the high density conventional polycrystalline SiC substrate while at the same time the substrate 100 is cheaper to manufacture relative to the high density conventional polycrystalline SiC substrate. In other words, the substrate 100 has both the lower cost of manufacturing the low density conventional polycrystalline SiC substrate and the better surface finishing of the high density conventional polycrystalline SiC substrate.

Figure 2A:
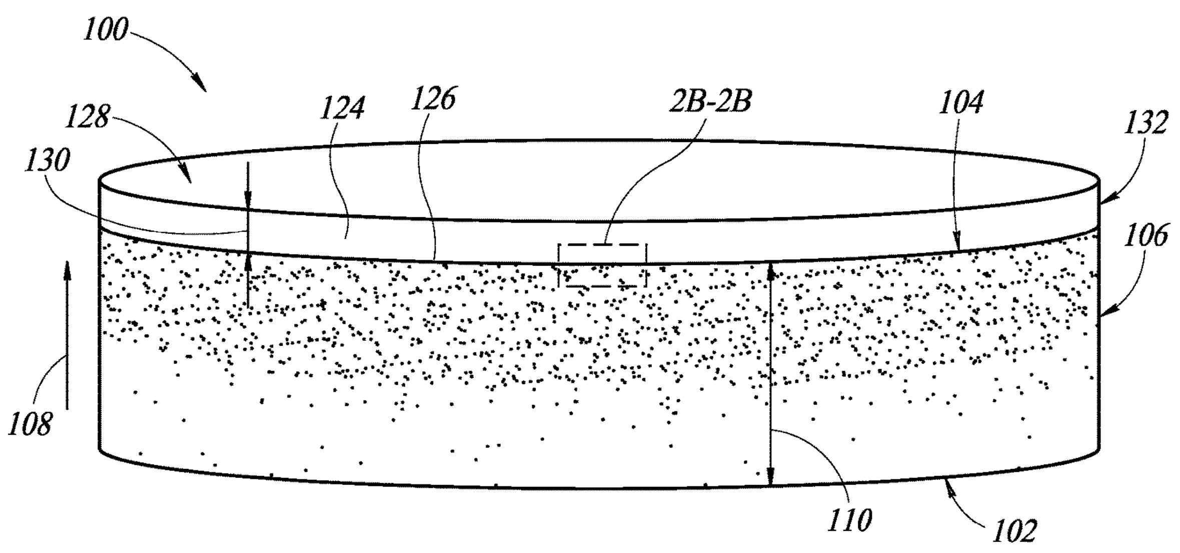
FIG. 2A is a side perspective view of the embodiment of the polycrystalline SiC substrate as shown in FIGS. 1A-1D that includes a monocrystalline layer.

FIG. 2A is a perspective side view of a monocrystalline layer 124 coupled to and on the embodiment of the second surface 104 of the substrate 100. The monocrystalline layer 124 may be a silicon carbide (SiC). The monocrystalline layer 124 is coupled or bonded to the second surface 104 of the substrate 100 at a coupling or bonding region 128 that is between the monocrystalline layer 124 and the substrate 100. The monocrystalline layer 124 has a surface 128 that faces away from the second surface 104 of the substrate 100 and faces away from the substrate 100. The monocrystalline layer 124 has a second thickness 130 that extends from the second surface 104 of the substrate 100 to the surface 128 of the monocrystalline layer 124. The second surface 104 of the substrate 100 is covered by the monocrystalline layer 124, and the monocrystalline layer 124 includes a second sidewall 132 that is transverse to the surface 128 and the second surface 104, that extends from the second surface 104 to the surface 128, and that is coplanar and flush with the first sidewall 106 of the substrate 100.

The second thickness 130 may be less than or equal to 1-micrometer (μm). In some embodiments, the second thickness 130 may be greater than 1-micrometer (μm).

Figure 2B:
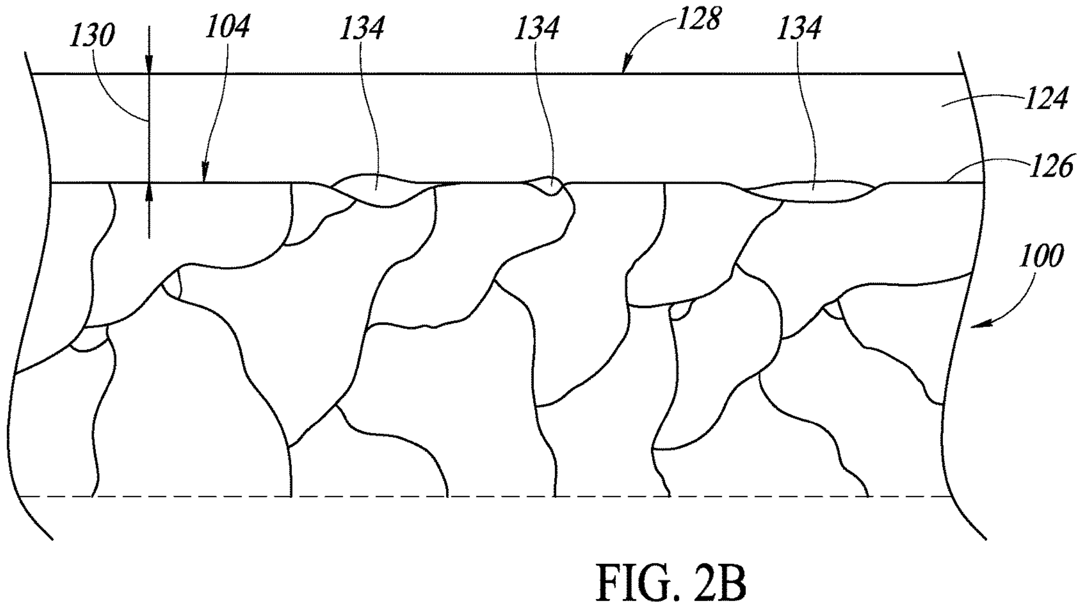
FIG. 2B is a zoomed in and enhanced view of section 2B-2B as shown in FIG. 2A at a location at which the monocrystalline layer is coupled to the surface of the embodiment of the polycrystalline SiC substrate as shown in FIGS. 1A-1D.
Figure 3:
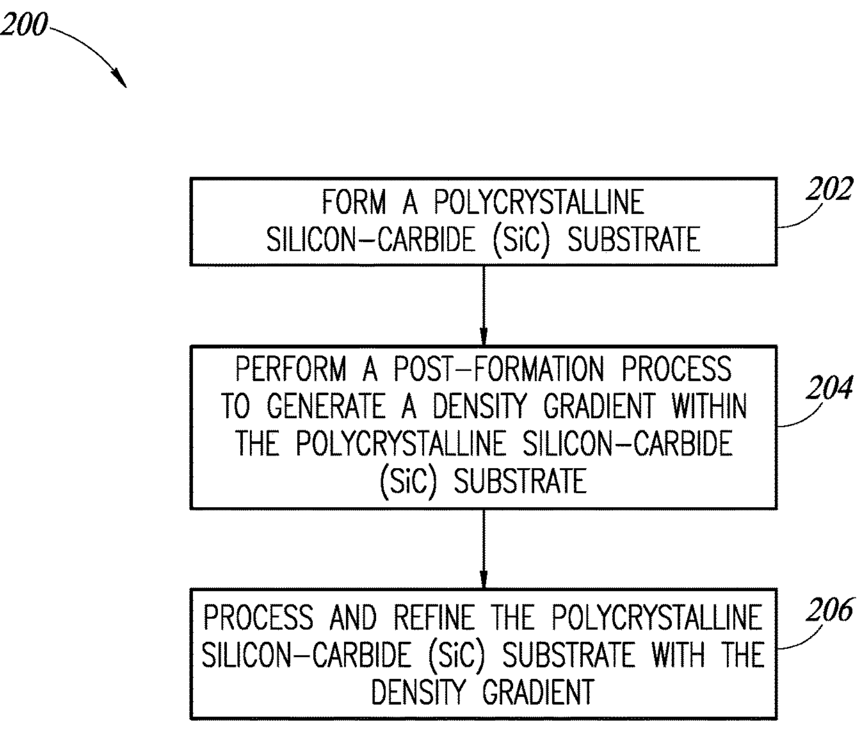
FIG. 3 is a flowchart of a method of manufacturing the embodiment of the polycrystalline SiC substrate as shown in FIGS. 1A-1D.

FIG. 2B is a zoomed in and enhanced view of section 2B-2B as encircled in FIG. 2A. As shown in FIG. 2B, at the bonding region one or more cavities 134 are between the monocrystalline layer 124 and the substrate 100. The one or more cavities 134 are present between the second surface 104 and the monocrystalline layer 124 due to the presence of the indentations 122 at the second surface 104 of the substrate 100 when the monocrystalline layer 124 is formed on, coupled to, or bonded to the second surface 104 of the substrate 100. In some embodiments, the one or more cavities 134 may not be present at all as there may be no indentations 122 altogether or the indentations 122 may be small enough such that the monocrystalline layer 124 fills the small indentations 122 at the second surface 104 of the substrate 100 when formed on, coupled to, or bonded to the second surface 104 of the substrate 100.

Even when the one or more cavities 134 are present due to the small indentations 122 at the second surface 104 of the substrate 100 after being planarized and polished, the one or more cavities 134 are small enough such that the one or more cavities 134 have little to no effect on impedance of a respective electrical signal that passes through the substrate 100 and the monocrystalline layer 124. Even when the one or more cavities 134 are present due to the small indentations 122 at the second surface 104 of the substrate 100 after being planarized and polished, there may only be a small number of the one or more cavities such that the one or more cavities have little to no effect on the impedance of a respective electrical signal that passes through the substrate 100 and the monocrystalline layer 124.

Figure 5:
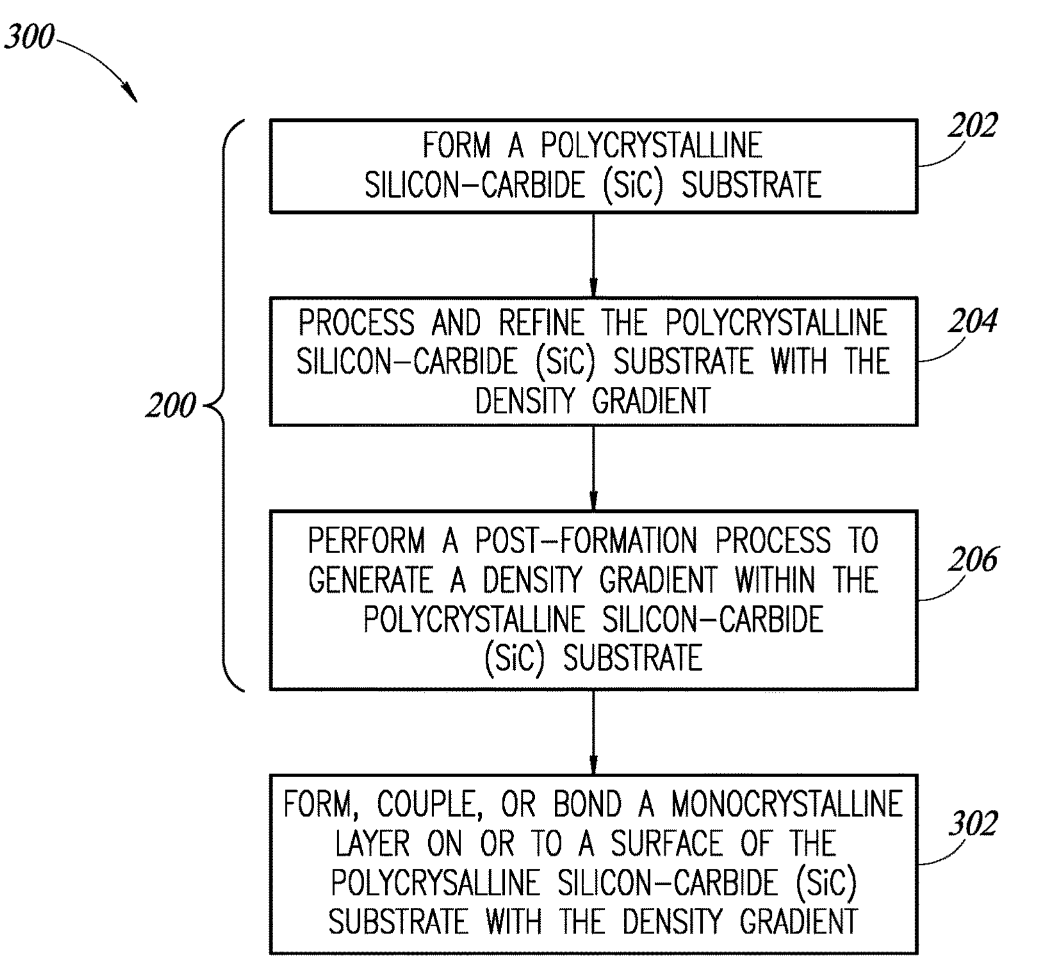
FIG. 5 is a flowchart of a method of manufacturing the monocrystalline layer on the embodiment of the polycrystalline SiC substrate in FIGS. 2A and 2B.

FIG. 5 is a flowchart 200 of a method of manufacturing the embodiment of the substrate 100 as shown in FIGS. 1A-1D. The flowchart 200 includes a first step 202, a second step 204, and a third step 206.

In the first step 202, a polycrystalline silicon carbide (SiC) base substrate 208, which may be referred to as a base substrate 208, is formed. For example, the base substrate 208 may be formed by utilizing a furnace to sinter together a mixture of a powdered silicon (Si) and a powdered carbon (C) forming the base substrate 208 or utilizing the furnace to sinter together a powdered silicon carbide (SiC) forming the base substrate 208. In other words, the base substrate 208 may be formed utilizing a sintering process known within a silicon carbide (SiC) substrate formation industry. After being formed, the base substrate 208 includes a first surface 210, which corresponds to the first surface 102, and a second surface 212, which correspond to the second surface 104, opposite to the first surface 210. The base substrate 208 includes a sidewall 214 that extends from the first surface 210 to the second surface 212 and is transverse to the first surface 210 and the second surface 212.

After the first step 202 in which the base substrate 208 is formed, the second step 204 is carried out in which a density gradient is formed or generated within the base substrate 208. The density gradient is formed or generated within the base substrate 208 by applying a first temperature 214 to the first surface 210 and a second temperature 216 to the second surface 212. The first temperature 214 is different than the second temperature 216. For example, the first temperature 214 is greater than the second temperature 216. The first temperature 214 may be greater than or equal to 2000 degrees Celsius and the second temperature 216 may be less than or equal to 2000 degrees Celsius. In some embodiments, the first temperature 214 may be greater than or equal to 2200 degrees Celsius and the second temperature 216 may be less than or equal to 2000 degrees Celsius. Applying the first temperature 214 to the first surface 210 and applying the second temperature 216 to the second surface 212 occurs simultaneously resulting in atoms and particles of the base substrate moving or being transported in a mass transport direction represented by an arrow 218. The mass transport direction 218 is directed away from the first surface and towards the second surface 212. As the atoms and particles move in the mass transport direction 218, a first density at the first surface 210 decreases and a second density at the second surface 212 increases. In other words, the second density at the second surface 212 becomes greater than the first density at the first surface 210. After the first temperature 214 has been applied to the first surface 210 and the second temperature 216 has been applied to the second surface 212 for a period of time, the base substrate 208 is allowed to cool. As the base substrate 208 cools down from previously being heated by the first temperature 214 and the second temperature 216, the first density at the first surface 210, the second density at the second surface 212, and the density gradient between the first surface 210 and the second surface 212 of the base substrate 208 solidifies. After the base substrate 208 is allowed to cool for a period of time, the base substrate 208 has the density gradient that increases along the substrate in the mass transport direction 218 with the second density at the second surface 212 being the greatest density of the base substrate 208 and the first density at the first surface 210 being the lowest density of the base substrate 208. The densities of the substrate between the first surface 210 and the second surface 212 are intermediate densities that are greater than the first density at the first surface 210 and less than the second density at the second surface 212.

In an alternative embodiment, the density gradient in the base substrate 208 between the first and second surfaces 210, 212 may be formed utilizing a chemical vapor deposition (CVD) process instead of applying the first temperature 214 to the first surface 210 and the second temperature 216 to the second surface 212. When the CVD process is utilized instead of applying the first and second temperatures 214, 216 to the base substrate 208, additional silicon carbide (SiC) or silicon (Si) and carbon (C) particles or atoms are introduced to the second surface 212 of the base substrate such that the additional SiC or Si and C particles and atoms impregnate the base substrate 208 at the second surface 212 resulting in the density gradient being formed within the base substrate 208 such that the second density at the second surface 212 is greater than the first density at the first surface 210 and intermediate densities between the first and second surfaces 210, 212 are greater than the first density and less than the second density. When the CVD process is utilized, the additional SiC or Si and C particles and atoms may impregnate the base substrate 208, filling the voids 114 at the second surface or at a depth within the base substrate less than a third thickness 220 of the base substrate that extends from the first surface 210 to the second surface 212, respectively. The third thickness 220 of the base substrate 208 may be greater than the first thickness 110 of the substrate 100.

In view of the above, in at least one embodiment, when the CVD process is carried out, a polycrystalline SiC substrate that is porous is placed within a furnace. A hydrogen gas flow is introduced into furnace. In the hydrogen gas flow, silane and ethene are introduced into the hydrogen gas flow. Alternatively, propane may be introduced into the hydrogen flow as a source of carbon. In other words, some source of carbon and some source of silicon is introduced into the hydrogen gas flow such that carbon and silicon are present within the hydrogen gas flow. By introducing the silane and ethene into the hydrogen gas flow, free silicon and free carbon are formed. These free silicon and free carbon are then deposited onto the porous substrate as silicon carbide. While the free silicon and free carbon are being deposited on the porous substrate, the furnace is at a temperature substantially equal to 1600 degree Celsius. This results in the free silicon and free carbon being deposited onto the porous substrate as silicon carbide (SIC). Furthermore, as the substrate is porous (i.e., has a porosity ranging from 7% to 23%, or equal to the upper and lower ends of this range), the silicon carbide (SiC) that is deposited onto the porous substrate actually impregnates the porous substrate filling voids within the porous substrate at or in close proximity to the second surface 212 of the base substrate 208. This results in the base substrate 208 being impregnated with silicon carbide such that the density gradient is formed between the first surface 210 and the second surface 212 of the base substrate 208.

After the second step 204 in which the density gradient has been formed and generated throughout the base substrate 208, a third step 206 is carried out in which the second surface 212 of the base substrate 208 is planarized (i.e., levelled) and polished (i.e., smoothed) by a planarizing and polishing tool 222, which may be a chemical mechanical planarization tool that rotates to planarize and polish the second surface 212 of the base substrate 208. After the second surface 212 has been planarized and polished by the planarizing and polishing tool 222, the polycrystalline SiC substrate 100 has been manufactured. The second surface 212 may be polished to have a roughness less than or equal to 5-angstrom (Å) such that the second surface 212 becomes the same or similar to the second surface 104 as discussed earlier herein.

Figure 4A:
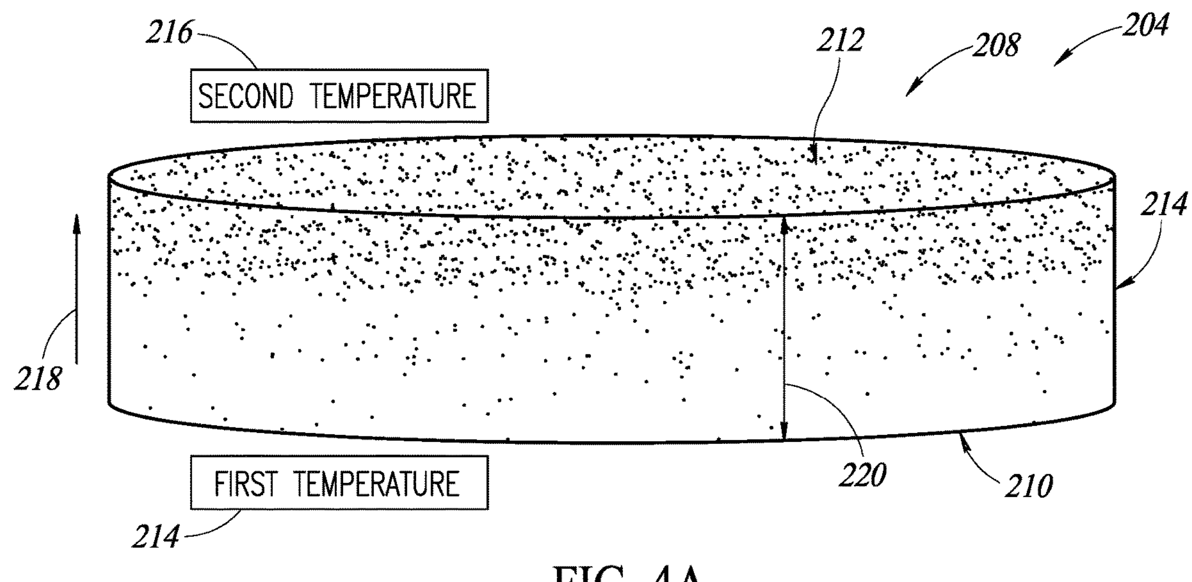
FIGS. 4A and 4B are side views of at least some respective steps of the embodiment of the method of manufacturing as shown in FIG. 3 to manufacture in FIGS. 1A-1D.

During the third step 206 as shown in FIG. 4A, the second surface 212 may be more readily planarized and polished effectively by the planarizing and polishing tool 222 as there are fewer of the voids 114 at, adjacent to, or in close proximity to the second surface 212 due to the densification process in the second step 204 in which the density gradient is formed within the base substrate such that the second density (e.g., high density) at the second surface 212 is greater than the first density (e.g., low density) at the first surface 210. In other words, if there are any of the indentations 122 present at the second surface 212 after being planarized and polished by the planarizing and polishing tool 222, the indentations 122 are small such that the second surface 212 has a roughness that is less than or equal to 20-angstrom (Å). In some embodiments, the indentations are small such that the second surface 212 has a roughness less than or equal to 5-angstrom (Å).

Figure 4B:
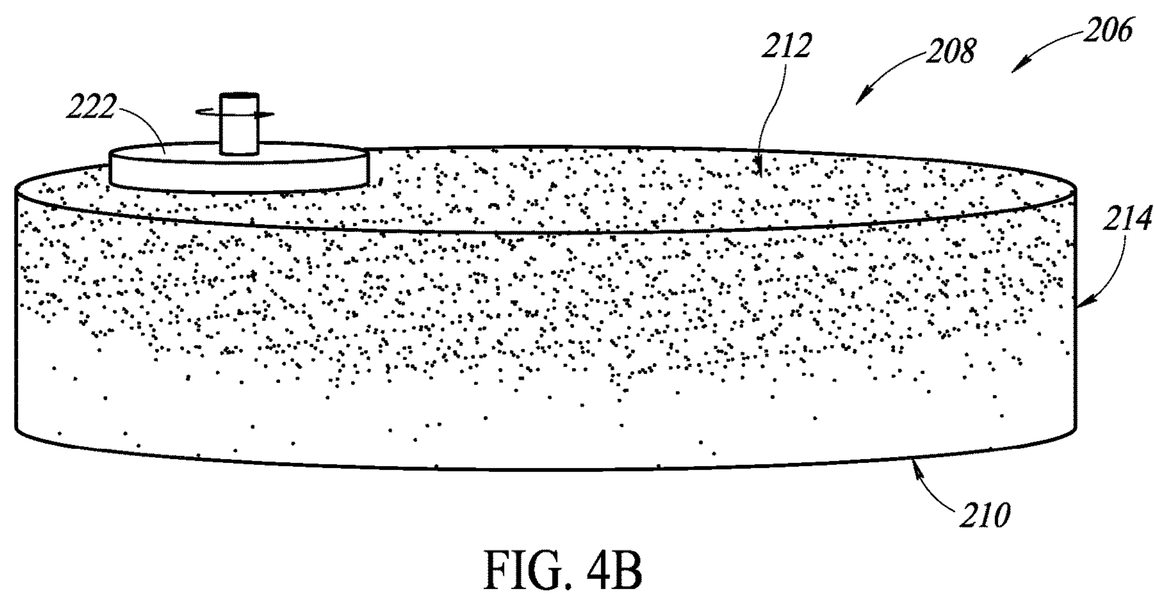

After the third step 206 as shown in FIG. 4B, the base substrate 208 has been converted into the substrate 100 as shown in FIGS. 1A-1C. In other words, after the method of manufacturing in the flowchart 200 is completed, the substrate 100 has been manufactured.

Utilizing the method of manufacturing in the flowchart 200 is less expensive than manufacturing a conventional polycrystalline SiC substrate with a high density through the entirety of the conventional polycrystalline SiC substrate as a greater amount of material is needed to manufacture the conventional polycrystalline SiC substrate with the high density through the entirety of the conventional polycrystalline SiC substrate relative to manufacturing the substrate 100. Also, utilizing the method of manufacturing in the flowchart 200 may be less expensive than manufacturing the high density conventional polycrystalline SiC substrate as less energy may be necessary to sinter together the base substrate 208 than forming a conventional base substrate with the high density throughout the entirety of the conventional base substrate that is then utilized to form the high density conventional polycrystalline SiC substrate.

While utilizing the method of manufacturing in the flowchart 200 to manufacture the substrate 100 is less expensive than manufacturing the high density conventional polycrystalline SiC substrate, the second density at the second surface 212 of the base substrate 208 being high and similar to the high density of the conventional high density polycrystalline SiC substrate allows for the second surface 212 of the base substrate 208 to be planarized and polished effectively and consistently to reduce a size of the indentations 122, to reduce a number of the indentations 122 present after planarizing and polishing, or to prevent the indentations 122 from being present altogether.

In view of the above discussion, the method of manufacturing the substrate 100 is less expensive than manufacturing the high density conventional polycrystalline SiC substrate that has a high density throughout its entirety while stills allowing for the second surface 212 to be planarized and polished effectively and consistently in a similar manner as to when a respective surface of the high density conventional polycrystalline SiC substrate is planarized and polished.

After the substrate 100 has been manufactured utilizing the processes as discussed herein, the substrate 100 may be utilized in forming electronic components such as semiconductor packages, semiconductor dice, or some other similar electronic or semiconductor component. For example, after the substrate 100 has been manufactured, the substrate 100 may be further refined or processed (e.g., singulation, back grinding, etc.) to form the electronic component. Alternatively, for example, one or more additional layers may be formed on, a semiconductor structure may be formed on, or a semiconductor structure may be coupled to the second surface 104 of the substrate 100 (e.g., the monocrystalline layer 124). For example, in at least one embodiment, the monocrystalline layer 124 is formed on the second surface 104, which will be discussed in greater detail with respect to FIG. 5 as follows herein.

FIG. 5 is a flowchart 300 of a method of manufacturing the monocrystalline layer 124 on the second surface 104 of the substrate 100. As shown in FIG. 5, the first, second, and third steps 202, 204, 206 in the flowchart 200 of the method of manufacturing the substrate 100 are carried out as discussed earlier herein. After the substrate 100 has been formed, a fourth step 302 is carried out in which the monocrystalline layer 124 is formed on, coupled to, or bonded to the second surface 104 of the substrate 100. For example, the monocrystalline layer 124 may be a wafer that is less thick than the substrate 100 that is bonded to, coupled to, or adhered to the second surface 104 of the substrate 100. Alternatively, the monocrystalline layer 124 may be formed on, bonded to, or coupled to the second surface 104 of the substrate 100 by depositing the monocrystalline layer 124 on the second surface 104 of the substrate by a depositing technique. For example, this depositing technique may be a sputtering technique, a vapor deposition technique, a crystal growing technique, or some other technique for forming, bonding, or coupling the monocrystalline layer 124 on or to the second surface 104 of the substrate 100.

In at least one embodiment, the monocrystalline layer 124 is directly and physically coupled to the second surface 212 in the fourth step 302. For example, the monocrystalline layer 124 may be formed by first coupling a monocrystalline substrate (not shown) to the second surface 212 through a SAB (surface activated bonding) technique by exposing the second surface 212 to a bombardment of Argon (Ar) ions or neutral atoms (e.g., a beam of particles that may be Argon (Ar), may be neutral atoms, or may be some other similar or like type of particle or atom that may be suitable) in an ultra-high vacuum to clean and activate the second surface 104 of the substrate 100. Once the second surface 104 has been cleaned and activated by the SAB technique, the monocrystalline substrate 124 is applied to the second surface 104 resulting in the monocrystalline substrate being physically and directly coupled to the second surface 104. Once the monocrystalline substrate has been directly and physically coupled to the second surface 104, a portion of the monocrystalline substrate is removed such that the monocrystalline layer 124 remains present at the second surface 212, which corresponds to the second surface 104 of the substrate 100. Before the second surface 212 is exposed to the bombardment of Argon (Ar) ions or neutral atoms, the second surface 212 may be planarized or polished.

In at least one alternative embodiment, a first conductive layer (not shown) is formed on the second surface 212 and a second conductive layer (not shown) is formed on a surface of the monocrystalline substrate to be coupled to the second surface 212. The first and second conductive layers may be formed through a sputtering technique. Once the first and second conductive layers have been formed the first and second layers may be cleaned and activated utilizing the SAB technique as discussed above and then applying the respective surface of the monocrystalline substrate to the second surface 212. After the monocrystalline substrate has been directly and physically coupled to the second surface 212, a portion of the monocrystalline substrate is removed such that the monocrystalline layer 124 remains present at the second surface 104 of the substrate. Before the first and second conductive layers is exposed to the bombardment of Argon (Ar) ions or neutral atoms, the first and second conductive layers may be planarized and polished.

If at least some of the indentations 122 are present at the second surface 104 of the substrate 100 when the monocrystalline layer 124 is formed on, bonded to, or coupled to the second surface 104 of the substrate 100, which corresponds to the second surface 212, the one or more cavities 134 may be formed and present between the monocrystalline layer 124 and the substrate 100. However, since these one or more cavities 134 are small, the one or more cavities have little to no impedance on an electrical signal when the electrical signal passes through the substrate 100 and the monocrystalline layer 124. Alternatively, there may be no indentations 122 such that there are none of the one or more cavities between the monocrystalline layer 124 and the substrate 100. Alternatively, the indentations 122 may be fully filled when forming, bonding, or coupling the monocrystalline layer 124 on or to the second surface of the substrate 100. By keeping the one or move cavities 134 small or by avoiding them altogether, there is little to no impedance on an electrical signal when the electrical signal passes through the substrate 100 and the monocrystalline layer 124 resulting in a more efficient and accurate device in which the substrate 100 and the monocrystalline layer 124 are incorporated.

When the one or more cavities are present between the substrate 100 and the monocrystalline layer 124, the one or more cavities have a size less than or equal to 10 micrometers (μm).

In view of the above discussion, the substrate 100 is cheaper to manufacture similar to manufacturing a low density conventional polycrystalline SiC substrate that has a low density through its entirety while having less roughness at the second surface when planarized and polished similar to planarizing or polishing a respective surface of a high density conventional polycrystalline SiC substrate.

After the monocrystalline layer 124 has been formed on or coupled to the second surface 104 of the substrate 100, the monocrystalline layer 124 may be further refined or processed (e.g., polished, thinned, etc.) to form the electronic component. Alternatively, for example, one or more additional layers may be formed on, a semiconductor structure may be formed on, or a semiconductor structure may be coupled to the monocrystalline layer 124 (e.g., dielectric layers, conductive layers, non-conductive layers, etc.).

After the monocrystalline layer 124 has been formed on or coupled to the second surface 104 of the substrate 100, the substrate 100 and the monocrystalline layer 124 one or more additional layers (e.g., dielectric layers, semiconductor layers, conductive layers, non-conductive layers, etc.) may be formed on the substrate 100 and the monocrystalline layer 124. Once these one or more additional layers are formed, the substrate 100, the monocrystalline layer 124, and the one or more additional layers may be singulated into individual die or may be singulated into individual stacked layer assemblies that may be further processed to form various semiconductor dice, semiconductor packages, semiconductor components, or other similar electronic components. The semiconductor dice, the semiconductor packages, the semiconductor components, or other similar electronic components may be positioned within a phone, a tablet, a computer, or some other similar electronic.

The individual die singulated from the substrate 100, the monocrystalline layer 124, and the one or more additional layers may then be encapsulated within a molding compound, epoxy, resin, or similar material to form a respective semiconductor package, semiconductor component, or other similar electronic component. The semiconductor package may be positioned within a phone, a tablet, a computer, or some other similar electronic.

The first density at the first surface 102 of the substrate 100 may have a lower density as compared to a density of a single crystal silicon carbide (SiC) substrate, and the second density at the second surface 102 of the substrate 100 may have a density similar to a density of a single crystal silicon carbide (SiC) substrate. However, the substrate 100 may be less expensive to manufacture as compared to manufacturing a high density polycrystalline SiC substrate and as compared to manufacturing a single crystal SiC substrate.

The substrate 100 may have a resistivity at the second surface 104 of the substrate 100 that is less than or equal to 20 milliohm-centimeters (mohm-cm). In some embodiments, the substrate 100 may have a resistivity at the second surface 104 of the substrate 100 that is less than or equal to 5 milliohm-centimeter (mohm-cm).

When the monocrystalline layer 124 is present on the substrate 100 with the density gradient, the monocrystalline layer 124 may be a resistivity less than 25 mohm-em or preferably equal to 18 mohm-cm or in the range of 15-20 mohm-cm or equal to the upper and lower ends of this range.

At least one embodiment of a device of the present disclosure may be summarized as including: a polycrystalline silicon carbide (SiC) wafer including a first side and a second side opposite to the first side; a first density at the first side of the polycrystalline silicon carbide (SIC) wafer; a second density at the second side of the polycrystalline silicon carbide (SiC) wafer, the second density being greater than the first density; and a density gradient between the first side and the second side, the density gradient increasing in density in a density gradient direction directed from the first side towards the second side of the polycrystalline silicon carbide (SiC) wafer.

The polycrystalline silicon carbide (SiC) wafer may further include a surface at the second side with a roughness less than 5-angstroms (Å).

A resistivity at the second side of the polycrystalline silicon carbide (SiC) wafer may be less than or equal to 20 milliohm-centimeter (mohm-cm).

A resistivity at the second side of the polycrystalline silicon carbide (SiC) wafer may be less than 5 milliohm-centimeter (mohm-cm).

A thickness that extends from the first side to the second side of the polycrystalline silicon carbide (SiC) wafer, and the thickness may be less than or equal to 800 micrometers (μm).

The device may further include a monocrystalline silicon carbide (SiC) layer may be coupled to the second side of the polycrystalline silicon carbide (SiC) wafer.

The polycrystalline silicon carbide (SiC) wafer may have a first thickness that extends from the first side to the second side; and the monocrystalline silicon carbide (SiC) layer may include: a surface that faces away from the polycrystalline silicon carbide (SiC) wafer; and a second thickness that extends from the second side to a surface of the monocrystalline silicon carbide (SiC) layer, and the second thickness may be less than the first thickness.

The second thickness may be less than or equal to 1-micrometer (μm).

The first thickness may be less than or equal to 800 micrometers (μm).

At least one embodiment of a method of the present disclosure may be summarized as including: forming a polycrystalline silicon carbide (SiC) substrate; after forming the polycrystalline silicon carbide (SiC) substrate, generating a density gradient between a first side of the polycrystalline silicon carbide (SiC) substrate and a second side of the polycrystalline silicon carbide (SiC) substrate opposite to the first side by motivating mass transport directed in a mass transport direction directed from the first side to the second side of a polycrystalline silicon carbide base substrate opposite to the first side, the motivating the mass transport including: exposing the first side of the polycrystalline silicon carbide (SiC) substrate to a first temperature transporting mass away from the first side of the polycrystalline silicon carbide (SiC) substrate; exposing the second side of the polycrystalline silicon carbide (SiC) substrate to a second temperature transporting mass toward the second side of the polycrystalline silicon carbide (SiC) substrate, the second temperature being less than the first temperature; and cooling the polycrystalline silicon carbide (SiC) substrate generating a first density at the first side of the polycrystalline silicon carbide (SiC) substrate, a second density at the second side of the polycrystalline silicon carbide (SiC) substrate greater than the first density, and the density gradient between the first side and the second side of the polycrystalline silicon carbide (SiC) substrate.

Forming the polycrystalline silicon carbide (SiC) substrate may include sintering at least one of the following of: a silicon carbide (SiC) powder; and a silicon (Si) and carbon (C) powdered mixture.

The second temperature may be greater than or equal to 2000 degrees Celsius.

The first temperature may be less than or equal to 2000 degrees Celsius.

The first temperature may be equal to 2000 degrees Celsius and the second temperature may be greater than or equal to 2100 degrees Celsius.

The method may further include coupling a monocrystalline silicon carbide (SiC) substrate to the second side of the polycrystalline silicon carbide (SiC) base substrate.

The density gradient may increase in the mass transport direction directed from the first side to the second side of the polycrystalline silicon carbide (SiC) substrate.

At least one embodiment of a method of the present disclosure may be summarized as including: generating a density gradient between a first side of a polycrystalline silicon carbide (SIC) substrate and a second side of the polycrystalline silicon carbide (SiC) substrate opposite to the first side, the generating the density gradient between the first side and the second side including: exposing the second side of the polycrystalline silicon carbide (SiC) substrate to a chemical vapor deposition process impregnating silicon (Si) and carbon (C) into the second side of the polycrystalline silicon carbide (SiC) substrate.

The method may further include coupling a monocrystalline silicon carbide (SiC) substrate to the second side of the polycrystalline silicon carbide (SiC) substrate.

The method may further include, before generating the density gradient between the first side of the polycrystalline silicon carbide (SiC) substrate and the second side of the polycrystalline silicon carbide (SiC) substrate, forming the polycrystalline silicon carbide (SiC) substrate by sintering at least one of the following of: a silicon carbide (SiC) powder; and a silicon (Si) and carbon (C) powdered mixture.

The density gradient may increase in a density gradient direction directed away from the first side of the polycrystalline silicon carbide (SiC) substrate and towards the second side of the polycrystalline silicon carbide (SiC) substrate.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
- a polycrystalline silicon carbide (SiC) wafer including a first side and a second side opposite to the first side;
- a first density at the first side of the polycrystalline silicon carbide (SiC) wafer;
- a second density at the second side of the polycrystalline silicon carbide (SiC) wafer, the second density being greater than the first density; and
- a density gradient between the first side and the second side, the density gradient increasing in density in a density gradient direction directed from the first side towards the second side of the polycrystalline silicon carbide (SiC) wafer.

2. The device of claim 1, wherein the polycrystalline silicon carbide (SiC) wafer further includes a surface at the second side with a roughness less than 5-angstroms (Å).

3. The device of claim 1, wherein a resistivity at the second side of the polycrystalline silicon carbide (SiC) wafer is less than or equal to 20 milliohm-centimeter (mohm-cm).

4. The device of claim 1, wherein a resistivity at the second side of the polycrystalline silicon carbide (SiC) wafer is less than 20 milliohm-centimeter (mohm-cm).

5. The device of claim 1, further comprising a thickness that extends from the first side to the second side of the polycrystalline silicon carbide (SiC) wafer, and the thickness is less than or equal to 800 micrometers (μm).

6. The device of claim 1, further comprising a monocrystalline silicon carbide (SiC) layer coupled to the second side of the polycrystalline silicon carbide (SiC) wafer.

7. The device of claim 6, wherein:
- the polycrystalline silicon carbide (SiC) wafer has a first thickness that extends from the first side to the second side; and
- the monocrystalline silicon carbide (SiC) layer includes:
  - a surface that faces away from the polycrystalline silicon carbide (SiC) wafer; and
  - a second thickness that extends from the second side to a surface of the monocrystalline silicon carbide (SiC) layer, and the second thickness is less than the first thickness.

8. The device of claim 7, wherein the second thickness is less than or equal to 1-micrometer (μm).

9. The device of claim 8, wherein the first thickness is less than or equal to 800 micrometers (μm).

10. A method, comprising:
- forming a polycrystalline silicon carbide (SiC) substrate;
- after forming the polycrystalline silicon carbide (SiC) substrate, generating a density gradient between a first side of the polycrystalline silicon carbide (SiC) substrate and a second side of the polycrystalline silicon carbide (SiC) substrate opposite to the first side by motivating mass transport directed in a mass transport direction directed from the first side to the second side of a polycrystalline silicon carbide base substrate opposite to the first side, the motivating the mass transport including:
  - exposing the first side of the polycrystalline silicon carbide (SiC) substrate to a first temperature transporting mass away from the first side of the polycrystalline silicon carbide (SiC) substrate;
  - exposing the second side of the polycrystalline silicon carbide (SiC) substrate to a second temperature transporting mass toward the second side of the polycrystalline silicon carbide (SiC) substrate, the second temperature being less than the first temperature; and cooling the polycrystalline silicon carbide (SiC) substrate generating a first density at the first side of the polycrystalline silicon carbide (SiC) substrate, a second density at the second side of the polycrystalline silicon carbide (SiC) substrate greater than the first density, and the density gradient between the first side and the second side of the polycrystalline silicon carbide (SiC) substrate.

11. The method of claim 10, wherein forming the polycrystalline silicon carbide (SiC) substrate includes sintering at least one of the following of:

a silicon carbide (SiC) powder; and a silicon (Si) and carbon (C) powdered mixture.

12. The method of claim 10, wherein the second temperature is greater than or equal to 2000 degrees Celsius.

13. The method of claim 12, wherein the first temperature is less than or equal to 2000 degrees Celsius.

14. The method of claim 10, wherein the first temperature is equal to 2000 degrees Celsius and the second temperature is greater than or equal to 2100 degrees Celsius.

15. The method of claim 10, further comprising coupling a monocrystalline silicon carbide (SiC) substrate to the second side of the polycrystalline silicon carbide (SiC) base substrate.

16. The method of claim 10, wherein the density gradient increases in the mass transport direction directed from the first side to the second side of the polycrystalline silicon carbide (SiC) substrate.

17. A method, comprising:

generating a density gradient between a first side of a polycrystalline silicon carbide (SiC) substrate and a second side of the polycrystalline silicon carbide (SiC) substrate opposite to the first side, the generating the density gradient between the first side and the second side including:

exposing the second side of the polycrystalline silicon carbide (SiC) substrate to a chemical vapor deposition process impregnating silicon (Si) and carbon (C) into the second side of the polycrystalline silicon carbide (SiC) substrate.

18. The method of claim 17, further comprising coupling a monocrystalline silicon carbide (SiC) substrate to the second side of the polycrystalline silicon carbide (SiC) substrate.

19. The method of claim 17, further comprising, before generating the density gradient between the first side of the polycrystalline silicon carbide (SiC) substrate and the second side of the polycrystalline silicon carbide (SiC) substrate, forming the polycrystalline silicon carbide (SiC) substrate by sintering at least one of the following of:

a silicon carbide (SiC) powder; and a silicon (Si) and carbon (C) powdered mixture.

20. The method of claim 17, wherein the density gradient increases in a density gradient direction directed away from the first side of the polycrystalline silicon carbide (SiC) substrate and towards the second side of the polycrystalline silicon carbide (SiC) substrate.

* * * * *